(12) United States Patent
Liu et al.

(10) Patent No.: US 10,082,318 B2
(45) Date of Patent: Sep. 25, 2018

(54) LINEAR FRESNEL LIGHT CONCENTRATING DEVICE WITH HIGH MULTIPLYING POWER

(71) Applicant: BEIJING TERASOLAR ENERGY TECHNOLOGIES CO., LTD., Beijing (CN)

(72) Inventors: Yang Liu, Beijing (CN); Qingbao Wang, Beijing (CN)

(73) Assignee: Beijing TeraSolar Energy Technologies Co., Ltd., Beijing (CN)

( * ) Notice: Subject to any disclaimer, the term of this patent is extended or adjusted under 35 U.S.C. 154(b) by 76 days.

(21) Appl. No.: 14/474,041

(22) Filed: Aug. 29, 2014

(65) Prior Publication Data

US 2014/0366868 A1    Dec. 18, 2014

Related U.S. Application Data

(63) Continuation of application No. PCT/CN2013/071799, filed on Feb. 22, 2013.

(30) Foreign Application Priority Data

Mar. 2, 2012    (CN) .......................... 2012 1 0054424

(51) Int. Cl.
*F24J 2/05* (2006.01)
*F24S 10/40* (2018.01)
(Continued)

(52) U.S. Cl.
CPC .............. *F24S 10/40* (2018.05); *F24S 10/45* (2018.05); *F24S 23/70* (2018.05); *F24S 23/77* (2018.05);
(Continued)

(58) Field of Classification Search
CPC .............. F24J 2/1047; F24J 2002/1066; F24J 2002/1076; F24S 10/40
(Continued)

(56) References Cited

U.S. PATENT DOCUMENTS 4,510,385 A * 4/1985 Welman ..................... F24J 2/38
                                                              126/577
4,784,700 A * 11/1988 Stern ....................... F24J 2/1047
                                                              126/658
(Continued)

FOREIGN PATENT DOCUMENTS

CN    101762079 A    6/2010
CN    101858649 A    10/2010
(Continued)

OTHER PUBLICATIONS

International Search Report of corresponding International PCT Application No. PCT/CN2013/071799, dated Feb. 22, 2013.
(Continued)

*Primary Examiner* — Avinash Savani
*Assistant Examiner* — Aaron Heyamoto
(74) *Attorney, Agent, or Firm* — J.C. Patents

(57) ABSTRACT

A linear Fresnel light concentrating device with high multiplying power, including a reflector field and a receiving unit, where the reflector field includes a plurality of arrays of one-dimensional linear convergence reflector strips; the linear receiving unit is arranged parallel to the reflector strips, and is provided with a secondary optical light concentrating unit inside, the height value of the receiving unit exceeds half of the width value of the reflector field, so as to obtain a relatively high primary convergence light concentrating multiplying power and secondary convergence light concentrating multiplying power, thereby realizing a high total convergence light concentrating multiplying
(Continued)

power. High multiplying power light concentration in low cost can be achieved, while the severe problem of low light concentration efficiency caused by extinction, tolerance rate and shading rate and the problem of inconvenience in repair and maintenance of the device are solved.

7 Claims, 4 Drawing Sheets

(51) Int. Cl.
    *F24S 23/70*     (2018.01)
    *G02B 19/00*     (2006.01)
    *G02B 3/08*     (2006.01)
    *H01L 31/054*     (2014.01)
    *F24S 23/79*     (2018.01)
    *F24S 30/425*     (2018.01)
    *F24S 23/77*     (2018.01)

(52) U.S. Cl.
    CPC .............. *F24S 23/79* (2018.05); *F24S 23/80* (2018.05); *F24S 30/425* (2018.05); *G02B 3/08* (2013.01); *G02B 19/0028* (2013.01); *G02B 19/0042* (2013.01); *H01L 31/0543* (2014.12); *H01L 31/0547* (2014.12); *F24S 2023/872* (2018.05); *Y02E 10/44* (2013.01); *Y02E 10/47* (2013.01); *Y02E 10/52* (2013.01)

(58) Field of Classification Search
    USPC ........................................................ 126/692
    See application file for complete search history.

(56) References Cited

U.S. PATENT DOCUMENTS

| | | | | |
|---|---|---|---|---|
| 5,154,163 A | * | 10/1992 | Rabl ........................ | F24J 2/10 126/690 |
| 5,505,917 A | * | 4/1996 | Collier, Jr. ............... | A61L 2/04 126/684 |
| 7,858,875 B2 | | 12/2010 | Lu ............................. | 136/246 |
| 2009/0038608 A1 | | 2/2009 | Caldwell .................... | 126/600 |
| 2009/0056703 A1 | * | 3/2009 | Mills ......................... | F24J 2/07 126/692 |
| 2009/0229264 A1 | | 9/2009 | Gilon et al. ................ | 60/641.8 |
| 2009/0241938 A1 | * | 10/2009 | Arbogast .................. | F02C 1/05 126/643 |
| 2009/0290244 A1 | * | 11/2009 | Cho .................... | G02B 26/0833 359/849 |
| 2010/0031991 A1 | | 2/2010 | Mochizuki et al. .......... | 136/206 |
| 2010/0051016 A1 | | 3/2010 | Ammar ...................... | 126/600 |
| 2010/0218807 A1 | | 9/2010 | Arbore et al. .............. | 136/246 |
| 2011/0149418 A1 | * | 6/2011 | Togino .................... | G02B 3/08 359/742 |
| 2011/0303214 A1 | | 12/2011 | Welle .......................... | 126/578 |
| 2012/0160302 A1 | * | 6/2012 | Citron .................... | F24J 2/1047 136/248 |

FOREIGN PATENT DOCUMENTS

| | | | | |
|---|---|---|---|---|
| CN | 201616788 U | 10/2010 | | |
| CN | 202018534 U | 10/2011 | | |
| CN | 102290462 A | 12/2011 | | |
| CN | 202583585 U | 12/2012 | | |
| JP | 62-299798 A | 12/1987 | | |
| WO | WO 2010100293 A1 | * | 9/2010 | .............. F24J 2/055 |
| WO | WO 2011/001545 A1 | 1/2011 | | |

OTHER PUBLICATIONS

The Chinese Second Examination Report of correspondence China patent application No. 201210054424.7, dated May 26, 2015.

The extended European Search Report, including the European search opinion of corresponding European patent application No. 13755000 and corresponding international PCT application No. PCT/CN2013/071799, dated Sep. 7, 2015

* cited by examiner

LINEAR FRESNEL LIGHT CONCENTRATING DEVICE WITH HIGH MULTIPLYING POWER

CROSS-REFERENCE TO RELATED APPLICATIONS

This application is a continuation of International Application No. PCT/CN2013/071799, filed on Feb. 22, 2013, which claims the priority benefit of Chinese Patent Application No. 201210054424.7, filed on Mar. 2, 2012, both of which are hereby incorporated by reference in their entireties.

TECHNICAL FIELD

The present invention relates to a solar light concentrating device and, more particularly to a linear Fresnel light concentrating device with high multiplying power.

BACKGROUND

Solar energy is a clean, environmentally friendly energy source. People have long been committed to its development and use. Especially in recent years, due to the rising oil price, increasing requirements for environmental protection and restraint of atmospheric carbon dioxide emissions, various countries have taken more efforts to carry out study on the utilization of solar energy, and especially put more efforts on how to obtain and utilize solar energy more efficiently.

Solar photo-thermal power generation is one of the most economical means to achieve high power generation in replacement of conventional energy sources. The respective advantage and disadvantage of three types of solar photo-thermal power generation is very obvious, for example, the tower type is of high efficiency, but at vast one-time expense; the trough type is of low cost, but with low efficiency relative to the tower type and the dish type; a stand-alone device of dish type can achieve standardized production, but the scale is difficult to expand.

Concentrating photovoltaic (CPV) refers to a technology directly converting the converged sunlight into electrical energy by photovoltaic cells with high conversion efficiency. Concentrating photovoltaic is also a choice to realize low cost solar power generation. Fresnel array scheme is one of the light concentrating methods.

A linear Fresnel solar light concentrating device primarily includes a linear Fresnel reflector strip system and a receiving unit. The linear Fresnel reflector strip system includes a linear reflector strip field. The linear reflector strip field is composed of a plurality of reflector strips disposed in parallel side by side, and the reflector strips, driven by a tracking unit, can track the movement of the sun, which ensures the incident light being reflected to the receiving unit continuously. The sunlight reflected by these reflector strips is concentrated toward the receiving unit disposed above these reflector strips, and the solar power is converted into thermal or electrical energy through the receiving unit. One receiving unit is usually disposed over a plurality of reflector strips to receive the sunlight reflected by the plurality of reflector strips.

In current linear Fresnel solar light concentrating systems, the Fresnel reflector field is arranged in a horizontal line and close to the basic plane such as the ground, which brings some inconvenient factors: 1. usually there is more dust contamination close to the ground; 2. the dust on the surface of the reflector strips of the Fresnel reflector field thickens after certain period, which severely reduces the reflectivity of the reflector strips and requires regular cleaning in a relatively short cycle, and meanwhile it is inconvenient for an operator to clean due to the compact arrangement of the Fresnel reflector field disposed above the ground, and operations can be done only by rotating the reflector strips to a vertical position and the operator enters from the gap between the reflector strips to operate, thus the width of the reflector strips must be very wide, e.g. 2 meters, so that there will be enough width for repair (the space for repair is about 2 m); the width of the reflector strips is of relatively large size, so the strength required needs to be enhanced and, thus, the cost can hardly be reduced; 3. the reflector strips are typically flat plate reflectors, which facilitates manufacturing, but tracking accuracy cannot be guaranteed, and the reception width of the receiving unit is greater than the width of the flat plate reflector strips; in order to obtain symmetrical arrangement of the Fresnel reflector field and less end loss effect (the converged light is heavily slanted from the axis of the receiver), the current reflector field generally adopts north-south layout, so the required tracking range is wide, e.g., plus or minus 80 degrees, thus, the tolerance rate of the reflector strips in the reflector field, especially those on edge of the reflector field, is very small (or the desired width of the receiving unit is very wide), and the receiving unit is arranged such that the height of the receiving unit which exceeds the field plane is smaller than half of the field width of the present group of fields, usually a quarter of the field width of the present group of fields; to obtain a higher concentrating multiple and a better tolerance rate and reduced cost, the width of the reflector filed is very wide and the number of the axes of reflector strips is large, which is of high cost and poor reliability; 4. the reflector field is arranged in a horizontal line, during the tracking process, the shading rate between the reflector strips especially the reflector strips on edge of each column of the reflector field is severe (the back of the front reflector strip occludes the light reflected by the back reflector strip), thereby reducing light concentration efficiency of the reflector strips; 5. the reflector field is directly arranged on the ground, occupying large areas, and the land utilization is not high, which is a waste of land resources; 6. the problem of low thermal efficiency resulted from low light concentrating multiple (the ratio of the total light reception width of the reflector strips to the width or diameter of the absorber tube under the condition of perpendicular incidence of the sunlight is about 30~60 times) is prevalent.

Therefore, how to improve light concentrating multiple, light concentration efficiency and reliability of the Fresnel reflector fields, overcome the inconvenience in repair and maintenance, reduce construction costs and improve land utilization, etc., has become a major issue in linear Fresnel light concentrating technology.

SUMMARY

The object of the present invention is mainly to solve one or more of the following problems: 1. low thermal efficiency and low thermal parameters resulting from low light concentrating multiple; 2. dust pollution in the air, low tolerance rate and severe shading problem which result in low light concentration efficiency of the light concentrating device; 3. inconvenience in repair and maintenance of the light concentrating device; 4. large occupied areas and low land utilization of the light concentrating device; 5. other problems affecting the cost and reliability.

To solve the problems above, the present invention provides a linear Fresnel light concentrating device with high multiplying power, including a reflector field and a receiving unit, where the reflector field includes a plurality of arrays of one-dimensional linear convergence reflector strips; the linear receiving unit is arranged parallel to the reflector strips, axis centers of rotation axes of the reflector strips are arranged on a symmetrical concave curve within a section vertical to the linear receiving unit; the height value of the receiving unit exceeds half of the width value of the reflector field (the height value of the receiving unit is defined as the difference between the location of the receiving unit and the average height of axis lines of reflector strips arranged parallel in multiple axes). Thus, relatively high primary convergence light concentrating multiplying power and secondary convergence light concentrating multiplying power can be obtained, and thus a high total convergence light concentrating multiplying power is realized.

In a further implementation, each of the one-dimensional linear convergence reflector strips of the reflector filed is a cylindrical convergence reflector strip, the number of columns of reflector strips is 4-10 columns, each of the reflector strips has the same rotating angle during the tracking process of the reflector filed, thereby reducing the number of rotating axes, lowering cost, and improving reliability and tracking accuracy.

In a further implementation, the height value of the receiving unit is 0.55-0.85 times as the width value of the reflector field.

Preferably, the axis centers of the rotation axes of the reflector strips are arranged on a curve within a section vertical to the linear receiving unit of the reflector filed in order to obtain less shading rate.

Preferably, in each unit of the reflector filed, the axis centers of the rotation axes of the reflector strips are arranged on a symmetrical concave curve within the section vertical to the linear receiving unit.

In a further implementation, the widths of the reflector strips are not identical. The closer the location of the reflector strip is to the center right under the receiving unit, the wider is the corresponding reflector strip, so as to make the reflector strip obtain similar tolerance rate, and reduce the number of the reflector strips.

Preferably, the symmetrical concave curve on which the axis centers of the rotation axes of the reflector strips are arranged within the section vertical to the linear receiving unit is fitted to two segments of straight lines; the two segments of straight lines are arranged along two straight lines which are distributed concavely and symmetrically and form an angle of less than 180° therebetween, connecting rod type multi-column linkage is utilized at left and right, respectively, which simplifies the structure and reduces costs.

In a further implementation, space for repair and maintenance is disposed under the bottom of the reflector field, by which staff and equipments approach apparatus such as the reflector columns to do installation, commissioning, cleaning, maintenance, etc.

In a further implementation, the linear Fresnel light concentrating device is applicable in the photovoltaic field. The receiving unit includes a solar battery pack in linear layout.

In this application, the secondary optical light concentrating unit disposed along the direction in parallel with the focal line by the solar battery pack in linear layout is a compound parabolic concentrator (CPC). The light along the direction of focal line is converged to some extent, which forms discontinuous quasi-two-dimensional light concentrating reception arranged along the direction of focal line.

In a further implementation, when the Fresnel light concentrating device is applicable in the photo-thermal field, the receiving unit includes a collector in linear layout.

In a further implementation, the receiving unit is a U-shape collector, realizing input and output in direction of the same end, which reduces the length of main pipe inside the reflector field and reduces the overall cost of light concentrating device; and a temperature control valve is installed at the outlet of each U-shape collector, maintaining heat transfer medium output at stable temperature and operation safety by detecting the temperature of medium at the outlet and controlling the flow.

Preferably, the linear collector includes a glass casing pipe, an inner absorber tube and a secondary optical light concentrating unit, where the secondary optical light concentrating unit is implemented as a compound parabolic concentrator (CPC).

In a further implementation, the internal space formed between the glass casing pipe and the inner absorber tube is kept in vacuum state, in order to reduce convection heat loss inside the collector, protect the absorption coating of the inner absorber tube and prolong its service life.

Preferably, the internal space formed between the glass casing pipe and the inner absorber tube is kept in dynamic vacuum state by continuous or intermittent air exhaust.

In a further implementation, the temperature at output end of the heat transfer medium inside the inner absorber tube is higher than 320° C. and lower than 550° C.

Preferably, the temperature at output end of the heat transfer medium inside the inner absorber tube is higher than 350° C. and lower than 450° C.; efficient receiving efficiency of the collector is obtained while obtaining high Fresnel light concentrating multiplying power, thereby alleviating the problem of high radiation loss due to pursuit of high temperature.

In a further implementation, the space for repair and maintenance is disposed under the bottom of the reflector field, the height of at least part of the space for repair and maintenance is greater than or equal to 1.5 meters from the ground.

In a further implementation, the space for repair and maintenance can be synthetically utilized, which can be designed as a parking lot, or a base for food, vegetables, flowers, or the roof of a building and so on, for example.

BRIEF DESCRIPTION OF DRAWINGS

Embodiments of the present invention will be described more specifically with reference to the accompanying drawings, in which.

DESCRIPTION OF EMBODIMENTS

Figure 1:
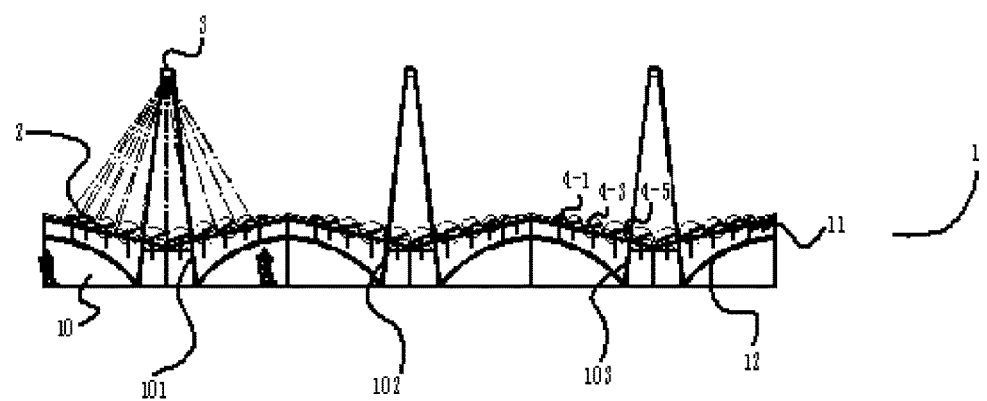
FIG. 1 is a schematic view of an array arrangement of a linear Fresnel light concentrating device with high multiplying power of the present invention.

FIG. 1 is a schematic view of an array arrangement of a linear Fresnel light concentrating device with high multiplying power of the present invention. As shown in FIG. 1, the array of the linear Fresnel light concentrating device with high multiplying power is arranged with a plurality of Fresnel light concentrating device units, for example, a light concentrating device unit 101, a light concentrating device unit 102 and a light concentrating device unit 103. Each Fresnel light concentrating device unit mainly includes a reflector field 2 supported high above and a receiving unit 3. The reflector field 2 includes a plurality of arrays of one-dimensional linear convergence reflector strips. The reflector field 2 can be composed of a plurality of columns of reflector strips 4 arranged parallel to each other. In the reflector field 2 of each unit, the axis centers of rotation axes of the reflector strips are arranged on a symmetrical concave curve within a section vertical to the linear receiving unit. The compact arrangement of strips is realized while the shading loss among the reflector strips 4 arranged in arrays within the reflector field 2 can be reduced or totally avoided so as to obtain lower shading rate. In an embodiment, in order to simplify the tracking drive mode, the symmetrical concave curve within the section vertical to the linear receiving unit, on which the axis centers of rotation axes of the reflector strips are arranged, is fitted to two segments of straight lines; the two segments of straight lines are arranged along two straight lines which are distributed concavely and symmetrically and form an angle of less than 180° therebetween, connecting rod type multi-column linkage is utilized at left and right, respectively, which simplifies the structure and reduces costs. As shown in FIG. 1, the reflector strips 4 arranged on the same side of the concave curve, such as reflector strip 4-1, reflector strip 4-3 and reflector strip 4-5, are fitted to the same straight line and a linkage rod 11 is arranged under each reflector strip 4, in order to realize the linkage of multiple reflector strips 4 in rod type, simplifying structure and reducing costs. To improve the mechanical strength of the reflector field 2, an arched supporting structure 12 is disposed under the reflector field 2 for supporting the reflector field 2.

The widths of the multiple columns of reflector strips 4 may be not identical, where the width of the reflector strip 4-5 arranged in middle of the reflector field 2 is greater than that of the reflector strip 4-1 and the reflector strip 4-3 arranged on two sides. That is, the width of the reflector strip 4 arranged inside each column of the reflector field 2 is related to its location inside the field. The closer the location is to the center right under the receiving unit 3, the wider is its corresponding reflector strip 4, so that the number of reflector strips can be reduced while making each reflector strip 4 obtain similar optical tolerance capacity. Too large width of the reflector strip 4 is unfavorable, with a proper size, while saving materials and space, the reflector accuracy of reflector strips 4 can also be improved. As the surface type of the reflector strip 4 is cylinder, it has certain convergence capacity, meanwhile the reflector field 2 is arranged in certain way such as north-south arrangement, the required range of tracking angle is relatively wide and there can be defocus and overfocus during the process of rotating around axis 5 thereof. The width of the reflector strip 4 is equivalent to or wider than the aperture of the receiving unit 3 when some high tolerance angle is guaranteed. Also the sunlight of different time can be reflected to the same space and there is enough tolerance angle, thus obtaining higher light concentrating multiple reliably, achieving better temperature of heat transfer medium, lowering the strength required by the device and reducing the construction costs. In practical operations, the reflector field 2 is disposed as flat plate reflector strips and special cylindrical reflector strips, cost can be controlled effectively while obtaining better reflector light concentration.

The receiving unit 3 is arranged parallel to the reflector strips, and disposed at the location of the focal line of the reflector field 2. The height value of the receiving unit 3 exceeds half of the width value of the field; where the height value of the receiving unit is defined as the difference between the location of the receiving unit and the average height of axis lines of reflector strips arranged parallel in multiple axes. Currently the height of the receiving unit of a common conventional linear Fresnel light concentrating system is generally less than half of the width of the field, commonly about ¼, and the included angle between rays converged to the receiving unit is larger, usually 95° to 125°. In embodiments of the present invention, the height of the receiving unit 3 is relatively higher than that of a conventional linear Fresnel light concentrating system, for example the height value of the receiving unit is 0.55-0.85 times as the width value of the field, the ratio is preferably 0.6-0.8, thus the angle between rays converged to the receiving unit is smaller (see FIGS. 1-2), e.g. 60° to 80°; and as each reflector strip which constitutes the solar reflector field can be a cylinder reflector strip with the capacity of one-dimensional convergence, and the convergence light figure which reaches the location of receiving unit gradually changes from overfocus to defocus periodically as the incident ray angle changes, when the height of the receiving unit is 0.55-0.85 times as the width, the converged reflector strips of the same width have a relatively small average width of light figure, a relatively high primary convergence light concentrating multiplying power can be obtained (the primary convergence light concentrating multiplying power refers to a ratio of the sum of the width of each cylinder convergence reflector to the width of rays converged to the receiving port of the receiving unit).

A secondary optical light concentrating unit is arranged in the receiving unit 3, the effect of small angle of rays incident to the secondary optical light concentrating unit can be obtained due to the height value of the receiving unit exceeding half of the width value of the field. And the capacity of light convergence formed by the secondary optical light concentrating unit is directly related with the angle of incident rays. The smaller the angle of incident rays is, the higher is the secondary convergence light concentrating multiplying power of the secondary optical light concentrating unit. The convergence capacity increases even more especially after the angle becomes smaller than 90 degrees. The total convergence light concentrating multiplying power of the whole linear Fresnel light concentrating device is the ratio of the total light reception width of the reflector strips of each Fresnel light concentrating device unit to the diameter of the absorber tube arranged within the collector or the width along the axis of photovoltaic battery under the condition of perpendicular incidence of rays. The total convergence light concentrating multiplying power of this example is equal to the product of the primary light concentrating multiplying power times the secondary light concentrating multiplying power of the secondary optical light concentrating unit, thus embodiments of the present invention can realize a relatively high concentrating multiple while utilizing less columns of reflector strips. For example, a very economical number of columns of reflector strips, such as 4-6 columns, are used to complete sunlight concentration with the concentrating multiple power equal to at least more than 100. When the number of columns of reflector strips is 6-10 columns, the highest concentrating multiple can be more than 180-200 and the tracking angle tolerance value can be kept high, which is reliable and practical. Relatively speaking, in the currently popular technology Compact Linear Fresnel Reflector (CLFR), more than 12 columns is usually used as the number of columns of reflector strips. Each column of reflector strips possesses a respective reflector strip rotating axis and driver correspondingly, which is expensive and complicated, the tracking accuracy is difficult to control, and additionally shading rate between adjacent reflector strips is caused to increase, or the drop in land area utilization rate occurs in order to obtain lower shading rate. Further, the multi-column mode brings too much installation, maintenance, repair and operation costs, even so the light concentrating multiple power of rays in this technology is still not high (generally at about 30-60), and the general economical efficiency is apparently insufficient.

The Fresnel light concentrating device is applicable in photo-thermal field. The receiving unit 3 is a linear collector. As shown in FIG. 1, the receiving unit 3 includes a single collector arranged parallel to the reflector field; the reflector field 2 includes at least 6 columns of reflector arrays in order to obtain relatively high light concentrating multiplying power; preferably, the height value of the receiving unit is 0.6-0.8 times as the width value of the field, the angle formed by the rays reflected from two end edges of the reflector and the location of the receiving unit is 64°-80°. A practical example is that the aperture of a single column of light concentrating device unit is 15 m, the collector is arranged 10.5 m high, a plurality of columns of reflector strips arranged in parallel according to the above arrangement converge the sunlight to the surface of the absorber tube arranged inside the collector containing secondary optical light concentrating unit. While ensuring that the reflector strips possesses a relatively wide tracking angle tolerance, the absorber tube can also obtain a light concentrating multiplying power of 100-200. Preferably, the light concentrating multiplying power is 120-150; in a practical example, the external diameter of the absorber tube in the light concentrating device unit is 100 mm, the light concentrating multiplying power is 120, the temperature at output end of the internal heat transfer medium can be controlled within 320° C.-550° C. Preferably, the temperature at output end of the heat transfer medium inside the inner absorber tube is higher than 350° C. and lower than 450° C.; While obtaining high Fresnel light concentrating multiplying power, efficient receiving efficiency of the collector can be obtained, alleviating the problem of high radiation loss due to pursuit of high temperature.

In an embodiment, space for repair and maintenance is arranged under the bottom of the reflector field, the height of at least part of the space for repair and maintenance 10 is greater than or equal to 1.5 meters from the ground, to facilitate staff checking and repairing the reflector field 2 below the reflector field or below the behind thereof. When cleaning and maintaining the reflector from below, the angle of the reflector is adjusted to upright or leaning downwards. Furthermore, this design can put the reflector field 2 relatively far away from the ground, which is effective in preventing moisture and dust; the extinction effect of dust layer on sunlight is reduced to some extent; below the space for repair and maintenance 10 a parking lot or a base for food, flower planting can also be designed, and also the linear Fresnel light concentrating device can be arranged on the roof of a building, etc., making full use of increasingly precious land resources.

The linear Fresnel light concentrating device is applicable in the photovoltaic field as well. In this case the receiving unit 3 includes a solar battery pack in linear layout, which converts the converged and reflected light into electric energy output. The solar battery pack in linear layout can be further provided with a compound parabolic concentrator (CPC) along the direction in parallel with the linear focal line. Then the light along the direction of focal line can be converged to some extent, requiring no active tracking in this dimension, which forms discontinuous quasi-two-dimensional light concentrating reception arranged along the direction of focal line.

Compared with a conventional Fresnel reflector field arranged along horizontal straight line on the ground, the following designs of the present Fresnel light concentrating device have numerous advantages: the design of the space for repair and maintenance 10 to a certain height above the ground, the design of axis centers of the reflector field 2 arranged on a concave curve, the design of the cylinder surface of the reflector strips 4. The advantages include: for example, the disadvantage of approaching the ground where there's much dust disturbance and serious moisture is reduced, and the direct incident light into the Fresnel reflector field and the receiving unit avoiding the dust layer can reduce extinction effect and improve the light concentration efficiency; the avoidance of the dust layer provides a longer cleaning cycle, facilitating the cleaning staff when doing regular cleaning, and the operation environment is superior, the routing inspection, maintaining and cleaning can be made at ease in the shady and cool space under the reflector field 2; thus the width of the reflector strip 4 (when doing cleaning, the reflector strips are vertically arranged, the width of strip is slightly smaller than width of gap between columns of strips) can be designed relatively wide requiring no consideration of the width of gap between reflector strips for the cleaning staff to enter, therefore the required cost drops; the reflector strips 4 are disposed as cylinder convergence structure, which possesses certain concentration capacity compared to the flat plate reflector strip, when a wide range of tracking angle is required, the reflector strips only need to complete defocus and overfocus, the width of the reflector strip 4 can be similar to or even wider than the width of the receiving unit 3, the size range is wide, the higher light concentrating multiple and better tolerance rate can be obtained.

Figure 2:
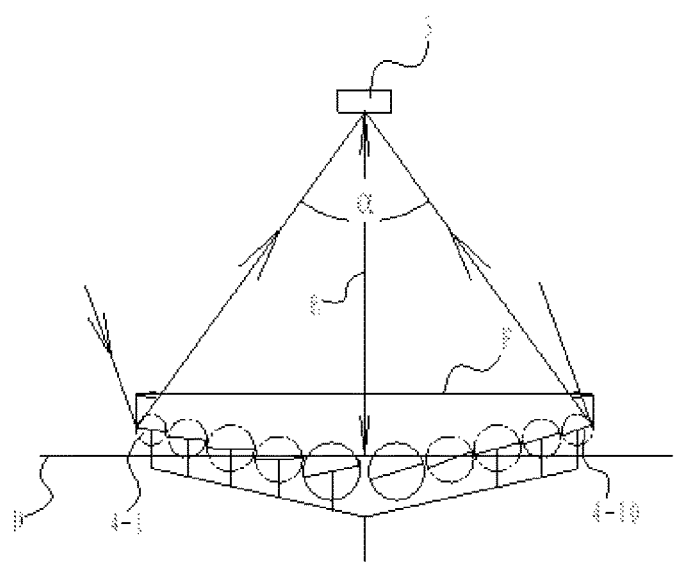
FIG. 2 is a schematic view of an incident ray angle of a linear Fresnel light concentrating device with high multiplying power of the present invention.

FIG. 2 is a schematic view of an incident ray angle of a linear Fresnel light concentrating device with high multiplying power. As shown in FIG. 2, the axis centers of rotation axes of the reflector strips are arranged on a symmetrical concave curve within the section vertical to the linear receiving unit. The average height of axis centers of various reflector strips is the height of the reflector strips, as illustrated by line D; the height value of the receiving unit is the difference between the location of the receiving unit and the average height of axis lines of reflector strips arranged parallel in multiple axes, as illustrated by line E; the width of reflector field is the sum of the light reception width of each reflector strip array in the case of vertical incidence (including the width of light leak between reflector strips), as illustrated by line F; the angle of incident rays is formed by the reflected rays and the receiving unit, where the reflected rays are incident from outer edges of the reflector strip 4-1 and the reflector strip 4-10 at two outermost ends of the reflector field unit to the receiving unit, as illustrated by α, preferably 60°-80°; the height value of the receiving unit of the linear Fresnel light concentrating device is 0.55-0.85 times as the width value of the field, preferably 0.6-0.8; the total convergence light concentrating multiplying power is defined as the ratio of the total light reception width of the reflector strip of each Fresnel light concentrating device unit to the diameter of the absorber tube arranged inside the collector or the width along the axis of photovoltaic battery under the condition of vertical incidence. The total convergence light concentrating multiplying power of the present example is equal to the product of the primary light concentrating multiplying power times the secondary light concentrating multiplying power of the secondary optical light concentrating unit.

Figure 3:
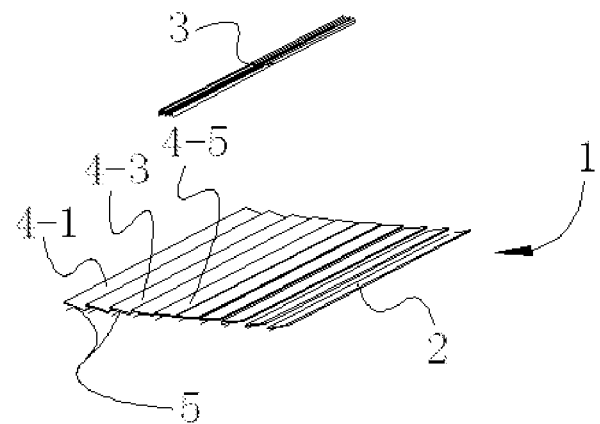
FIG. 3 is a schematic view of an integral structure arrangement of a linear Fresnel light concentrating device with high multiplying power according to an embodiment of the present invention.

FIG. 3 is a schematic view of an integral structure arrangement of a linear Fresnel light concentrating device with high multiplying power. As shown in FIG. 3, the integral structure 1 of the linear Fresnel light concentrating device primarily includes a reflector field 2 and a receiving unit 3; the reflector field 2 is composed of reflector strips 4 arranged in parallel; a plurality of reflector strips 4, such as reflector strip 4-1, reflector strip 4-3, reflector strip 4-5, are arranged regularly in arrays in east-west direction, the surface type of the reflector strip 4 can be cylinder and it can rotate around its axis 5, the sunlight of different time can be reflected to the same space; the plurality of reflector strip 4-1, reflector strip 4-3 and reflector strip 4-5 can reflect and converge the sunlight to the same space, forming a common focal line; the receiving unit 3 is arranged at the location of the focal line of the reflector field 2, in which the receiving unit 3 can be composed of a plurality of U-shape collectors arranged in parallel with each other.

Figure 4:
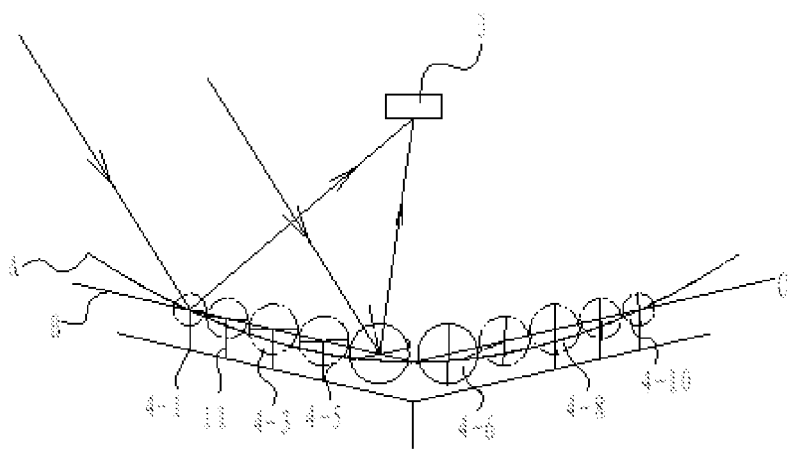
FIG. 4 is a schematic view of a structure arrangement of a reflector field according to an embodiment of the present invention.

FIG. 4 is a schematic view of a structure arrangement of a reflector field. As shown in FIG. 4, the reflector field 2 includes a plurality of reflector strips 4 such as reflector strip 4-1, reflector strip 4-3, reflector strip 4-5, reflector strip 4-6, reflector strip 4-8 and reflector strip 4-10, converging sunlight to the area around the receiving unit 3 (location of the convergence point, not shown in figure) after regular arrangement. The locations of reflector strip 4-1, reflector strip 4-3, reflector strip 4-5 are respectively in the location status of normal reflecting rays when sunlight incident at certain moment; in practical operations, the location status of the reflector strips 4 which are at the same moment but different locations and correspondingly converge the sunlight to the area around the receiving unit 3 is different.

In addition, the widths of the reflector strips 4 at different locations of the reflector field 2 are different. The closer the reflector strip 4 is arranged to the center right under the receiving unit 3, the wider is the width of the reflector strip 4. For example, the width of reflector strip 4-5 is greater than that of reflector strip 4-1.

In order to realize coordinated linkage of multiple reflector strips 4 in rod type, the reflector field originally arranged along curve A is fitted to two straight lines, straight line B and straight line C, so as to be divided into two groups which are independently tracked by the linkage rod 11 in a coordinated manner. The right part of FIG. 4 schematically illustrates a non-working state, i.e. cleaning state, of the reflector field 2. The cleaning mode is initiated when the reflecting surface of the reflector field 2 is unclean and not suitable to perform tracking to obtain solar energy someday. The orientations of the reflector strips in the reflector field 2, such as reflector strip 4-6, reflector strip 4-8 and reflector strip 4-10, are changed to an approximately vertical position for cleaning.

Figure 5:
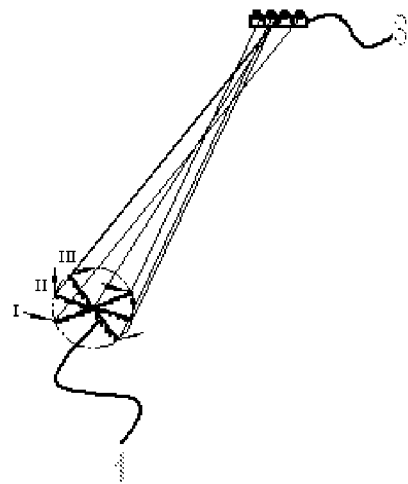
FIG. 5 is a schematic structural view of a cross section of a single reflector strip of the present invention.

FIG. 5 is a schematic structural view of a cross section of a single reflector strip. FIG. 5 schematically illustrates part of the structure of the reflector strip 4 and the receiving unit 3. In the figure, the reflecting surface of the reflector strip 4 is a cylindrical surface. The figure shows three different reflector states, I, II, III, respectively, of the reflector strip 4 corresponding to three states of incident sunlight with the angle of −75°, 0, 75°. The reflector strip 4 rotates around its axis 5. The surface type of the reflector strip 4 is a cylindrical surface, which possesses certain concentration capacity, meanwhile the reflector field 2 is arranged in north-south direction, the required range of tracking angle is relatively wide and there can be defocus (shown in dotted line corresponding to the reflector state III) and overfocus (shown in bold solid line corresponding to the reflector state I) during the process of rotating around axis 5 thereof. The width of the reflector strip 4 can be equal to or even wider than the aperture of the receiving unit 3 when a certain high tolerance angle is guaranteed. Therefore, the sunlight at different time can be reflected to the space of the receiving unit 3, thus obtaining higher light concentrating multiple and better temperature of heat transfer medium, lowering the strength required by the device and reducing the construction costs.

Figure 6:
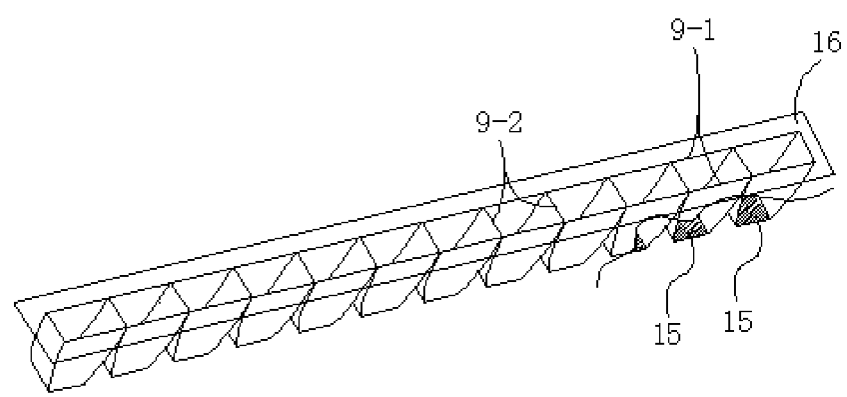
FIG. 6 is a schematic view of a structure arrangement of a photovoltaic solar battery pack being a receiving unit according to an embodiment of the present invention.

FIG. 6 is a schematic view of a structural arrangement of a photovoltaic solar battery pack as a receiving unit. As shown in FIG. 6, the structure of the photovoltaic solar battery pack is rotated to a front view for convenience of description. The solar battery pack is composed of a plurality of solar batteries 15 arranged in series in linear layout, which are disposed at the location of linear focal line of the Fresnel light concentrating device. Two sorts of compound parabolic concentrators (CPC) 9 are disposed around the solar battery pack which is arranged in linear layout, which are a compound parabolic concentrator (CPC) 9-1 and a compound parabolic concentrator (CPC) 9-2, respectively, where the compound parabolic concentrator (CPC) 9-1 is disposed and arrayed along the direction parallel to linear focal line to converge rays vertical to the linear focal line to some extent, and the compound parabolic concentrator (CPC) 9-2 is disposed along the direction vertical to linear focal line (radial direction) and arrayed along the direction parallel to the linear focal line. After incident to the compound parabolic concentrator (CPC) 9-2, the sunlight is reflected to photovoltaic batteries 15 disposed at the bottom of the compound parabolic concentrator (CPC) 9, thus the increase in tolerance performance along the direction vertical to the linear focal line can be realized. Meanwhile the number of photovoltaic batteries receiving along the direction parallel to linear focal line is reduced, which improves light concentrating multiple and utilization efficiency, and forms discontinuous quasi-two-dimensional light concentrating reception arranged along the direction of focal line; the aperture location of a plurality of compound parabolic concentrators (CPC) can be sealed by providing a high-transmittance thin glass 16, which forms an airtight space chamber with the photovoltaic batteries 15, protecting the reflecting coating of the compound parabolic concentrator (CPC) 9 to ensure its utilization efficiency and improve the service life thereof.

Figure 7:
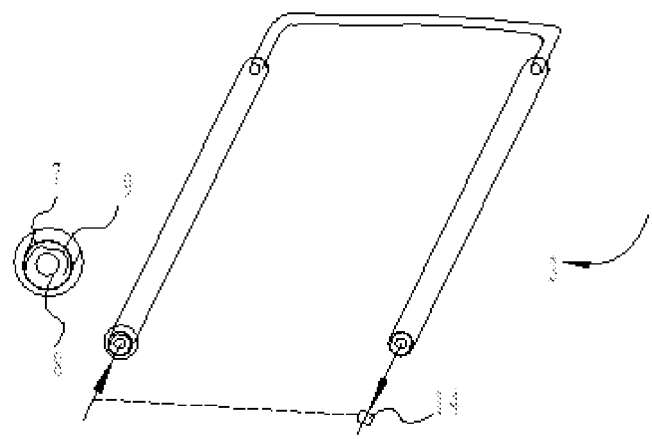
FIG. 7 is a schematic structural view of a receiving unit according to an embodiment of the present invention.

FIG. 7 is a schematic structural view of a receiving unit. As shown in FIG. 7, the receiving unit 3 is structured as linear collector, which includes a glass casing pipe 7, an inner absorber tube 8 and a secondary optical light concentrating unit. The secondary optical light concentrating unit is, for example, a compound parabolic concentrator (CPC) 9. In practical operations, the adjacent collectors can be connected to each other, forming an integral U-shape collector, which allows the inlet and outlet to be at the same end. Each U-shape collector can be provided with a temperature control valve 14, which operates steadily and reliably and is easy to be constructed; the outlet temperature can be detected by the temperature control valve 14, and the flow is controlled according to the temperature, thus keeping the heat transfer medium output at certain steady temperature and operation safety. The inside of the inner absorber tube 8 of the U-shape collector is heat transfer medium, the inner absorber tube 8 with good absorption coating is arranged in the glass casing pipe 7, and the internal space formed therebetween is kept in vacuum state or in dynamic vacuum state by continuous or intermittent air exhaust, so as to reduce convection heat loss inside the U-shape collector, protect the absorption coating of the inner absorber tube 8 and prolong its service life. In order to improve the capacity of receiving sunlight, increase the tolerance of the receiving unit 3 and obtain higher light concentrating multiplying power and better evenness of light reception, the compound parabolic concentrator (CPC) 9 is arranged inside the collector, which improves the optical light concentrating multiplying power, and meanwhile facilitates the even distribution of the heat on tube wall of the inner absorber tube.

Figure 8:
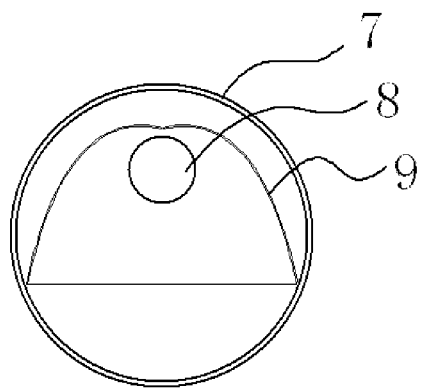
FIG. 8 is a schematic structural view of a cross section of a receiving unit according to an embodiment of the present invention.

FIG. 8 is a schematic structural view of a cross section of a receiving unit. As shown in FIG. 8, the receiving unit includes a glass casing pipe 7, a compound parabolic concentrator (CPC) 9 and an inner absorber tube 8; the compound parabolic concentrator (CPC) 9 and the inner absorber tube 8 are disposed in parallel inside the glass casing pipe 7 in an upper and lower positional relation; where the absorber tube 8 is an independent absorber tube implementing the mode of inputting heat transfer medium from one side and outputting to the other side.

Apparently, various variations can be made in the present invention without departing from the spirit and scope of the invention described here. Therefore, all the variations obvious to those skilled in the art should be included within the scope of the claims. The protection scope of the present invention is only defined by the claims to be described below.

What is claimed is:

1. A linear Fresnel light concentrating device with high multiplying power, comprising a reflector field and a receiving unit (3), wherein the reflector field (2) comprises a plurality of arrays of one-dimensional linear convergence reflector strips (4); the receiving unit (3) is arranged parallel to the reflector strips (4), a height value of the receiving unit (3) exceeds half of a width value of the reflector field;
    wherein, the height value of the receiving unit (3) is 0.55-0.85 times as the width value of the reflector field, and the height value is the difference value between the height of the location of the receiving unit (3) and the average value of the height of axis lines of reflector strips (4) arranged parallel in multiple axes;
    wherein, a width of a reflector strip (4) further away from a center right under the receiving unit (3) is smaller than a width of a reflector strip (4) closer to the center right under the receiving unit (3), and the width of a reflector strip is a distance between two long sides of the reflector strips (4);
    wherein, each of the one-dimensional linear convergence reflector strips (4) of the reflector field (2) is a reflector strip with a reflecting component having a cylindrical shape;
    wherein the receiving unit (3) comprises a collector in linear layout, the collector in linear layout comprises a glass casing pipe (7), an inner absorber tube (8) and a compound parabolic concentrator (9), and the compound parabolic concentrator (9) and the inner absorber tube (8) are disposed in parallel inside the glass casing pipe (7).

2. The linear Fresnel light concentrating device according to claim 1, wherein the number of columns of the reflector strips is 4-10 columns.

3. The linear Fresnel light concentrating device according to claim 1, wherein axis centers of rotation axes of the reflector strips (4) are arranged on a symmetrical concave curve within a section vertical to the receiving unit (3).

4. The linear Fresnel light concentrating device according to claim 3, wherein the symmetrical concave curve on which the axis centers of the rotation axes of the reflector strips (4) are arranged within the section vertical to the receiving unit (3) is fitted to two segments of straight lines.

5. The linear Fresnel light concentrating device according to claim 1, wherein the receiving unit (3) is a U-shape collector.

6. The linear Fresnel light concentrating device according to claim 1, wherein a space for repair and maintenance is disposed under the bottom of the reflector field, and the height of at least part of the space for repair and maintenance (10) is greater than or equal to 1.5 meters from ground.

7. The linear Fresnel light concentrating device according to claim 1, wherein the receiving unit (3) comprises a solar battery pack in linear layout.

* * * * *